United States Patent
Hwang

(10) Patent No.: US 9,520,882 B2
(45) Date of Patent: Dec. 13, 2016

(54) RECEIVER CIRCUIT OF SEMICONDUCTOR APPARATUS

(71) Applicant: SK hynix Inc., Icheon-si Gyeonggi-do (KR)

(72) Inventor: Jin Ha Hwang, Icheon-si (KR)

(73) Assignee: SK HYNIX INC., Icheon-Si (KR)

( * ) Notice: Subject to any disclaimer, the term of this patent is extended or adjusted under 35 U.S.C. 154(b) by 0 days.

(21) Appl. No.: 14/515,899

(22) Filed: Oct. 16, 2014

(65) Prior Publication Data

US 2016/0006418 A1   Jan. 7, 2016

(30) Foreign Application Priority Data

Jul. 7, 2014  (KR) .................. 10-2014-0084574

(51) Int. Cl.
*H03L 7/06* (2006.01)
*H03K 3/356* (2006.01)

(52) U.S. Cl.
CPC ........... *H03L 7/06* (2013.01); *H03K 3/356139* (2013.01); *H03K 3/356191* (2013.01)

(58) Field of Classification Search
CPC ........ H03K 3/012; H03K 5/135; H03K 17/22; H03K 17/16; H03K 19/0016; H03L 7/0816; H03L 5/00; H03L 7/0814; H03L 7/0818
USPC ......................... 327/143, 198, 202, 217, 218
See application file for complete search history.

(56) References Cited

U.S. PATENT DOCUMENTS

| | | | | |
|---|---|---|---|---|
| 5,952,861 | A * | 9/1999 | Kim ................. | H03K 3/037 327/200 |
| 2003/0164719 | A1* | 9/2003 | Mohan ............ | H03K 3/356139 327/65 |
| 2006/0119406 | A1* | 6/2006 | Henzler ............ | G11C 11/412 327/208 |
| 2009/0284286 | A1* | 11/2009 | van den Berg ...... | H03B 21/00 327/107 |
| 2011/0109348 | A1* | 5/2011 | Chen ................ | H03K 5/2481 327/65 |
| 2013/0002325 | A1* | 1/2013 | Lee ................. | H03K 3/356139 327/198 |
| 2014/0266306 | A1* | 9/2014 | Cullinane .......... | H03K 3/012 327/50 |

FOREIGN PATENT DOCUMENTS

KR   1020090044055 A   5/2009

OTHER PUBLICATIONS

Michael Bucher, et al. A 6.4-Gb/s Near-Ground Single-Ended Transceiver for Dual-Rank DIMM Memory Interface Systems, journal, Jan. 2014, 127-139, vol. 49, No. 1, IEEE Journal of Solid-Sate Circuits.

* cited by examiner

*Primary Examiner* — John Poos
(74) *Attorney, Agent, or Firm* — William Park & Associates Ltd.

(57) ABSTRACT

A receiver circuit of a semiconductor apparatus may include, a latch comprising differential input terminals and differential output terminals. The receiver circuit may also include a control unit configured to selectively reset first and second intermediate nodes coupled between the differential input terminals and the differential output terminals according to previous data.

20 Claims, 4 Drawing Sheets

RECEIVER CIRCUIT OF SEMICONDUCTOR APPARATUS

CROSS-REFERENCES TO RELATED APPLICATION

The present application claims priority under 35 U.S.C. §119(a) to Korean application number 10-2014-0084574, filed on Jul. 7, 2014, in the Korean Intellectual Property Office, which is incorporated herein by reference in its entirety.

BACKGROUND

1. Technical Field

Various embodiments generally relate to a semiconductor apparatus, and more particularly, to a receiver circuit of a semiconductor apparatus.

2. Related Art

A semiconductor apparatus includes a receiver circuit for receiving data from outside the semiconductor apparatus.

In order to improve the performance of the semiconductor apparatus, the receiver circuit may need to be designed to be insensitive to input noise and to operate with a low current, to possess a high receiving efficiency.

SUMMARY

In an embodiment of the present disclosure, a receiver circuit of a semiconductor apparatus may include a latch unit configured to change logic levels of differential output terminals according to a difference between two data inputted through differential input terminals, and a reset unit configured to perform an equalization function by selectively resetting first and second intermediate nodes coupled between the differential input terminals and the differential output terminals in response to control signals. The receiver circuit of a semiconductor apparatus may also include a control unit configured to generate the control signals according to a reset condition and previous input data.

In an embodiment of the present disclosure, a receiver circuit of a semiconductor apparatus may include, a latch unit comprising differential input terminals and differential output terminals, and a control unit configured to selectively reset first and second intermediate nodes coupled between the differential input terminals and the differential output terminals according to previous data.

In an embodiment of the present disclosure, a receiver circuit of a semiconductor apparatus, may include, a latch unit configured to change logic levels of differential output terminals according to a difference between a first data and a second data inputted through differential input terminals, and a feedback signal generation unit configured to output signals obtained by latching outputs of the differential output terminals as differential feedback signals. The receiver circuit of the semiconductor apparatus may also include a reset unit configured to perform an equalization function by selectively resetting first and second intermediate nodes coupled between the differential input terminals and the differential output terminals in response to control signals, and a control unit configured to generate the control signals in response to the differential feedback signals and a clock signal.

DETAILED DESCRIPTION

Hereinafter, a receiver circuit of a semiconductor apparatus according to the present disclosure will be described below with reference to the accompanying drawings through various examples of embodiments.

Various embodiments may be directed to a receiver circuit of a semiconductor apparatus capable of increasing receiving efficiency and reducing current consumption.

Figure 1:
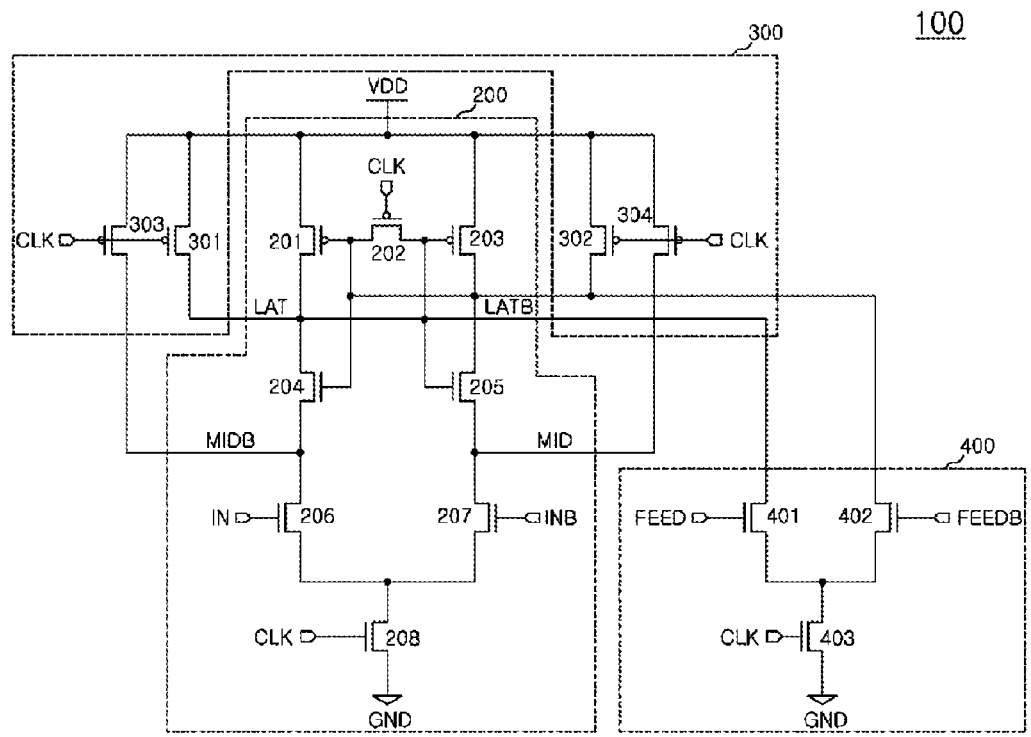
FIG. 1 is a circuit diagram of a representation of a receiver circuit of a semiconductor apparatus according to an embodiment.
Figure 1:
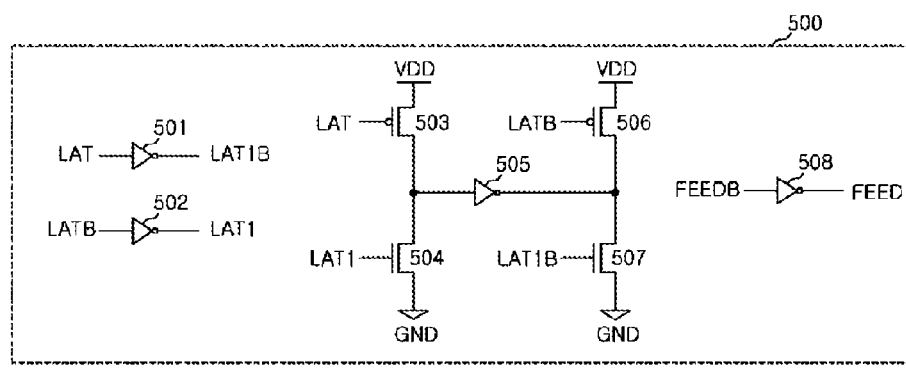

Referring to FIG. 1, a receiver circuit 100 of, for example, a semiconductor apparatus according to an embodiment may include a latch unit 200, and a reset unit 300. The receiver circuit may also include an equalization unit 400, and a feedback signal generation unit 500.

The latch unit 200 may be configured to change the logic levels of differential output terminals LAT/LATB. The changing of the logic levels may be performed in accordance with a difference between two pieces of data or two or more data (i.e., a first data and a second data) received through differential input terminals IN/INB (i.e., a first input terminal IN and a second input terminal INB), when a clock signal CLK is activated to a high level (i.e., voltage level and/or logic level).

When the clock signal CLK is deactivated to a low level (i.e., voltage level and/or logic level), the latch unit 200 and a ground terminal GND may be decoupled from each other.

The latch unit 200 may be implemented with a cross-coupled latch, and may include first to eighth transistors 201 to 208.

The first transistor 201 and the third transistor 203 may be respectively coupled between a power supply terminal VDD and the differential output terminals LAT/LATB (i.e., a first output terminal LAT and a second output terminal LATB).

The source and drain of the second transistor 202 may be coupled to the gate of the first transistor 201 and the gate of the third transistor 203, respectively.

The gate of the second transistor 202 may be configured to receive the clock signal CLK.

The fourth transistor 204 and the fifth transistor 205 may be respectively coupled between the differential output terminals LAT/LAB and intermediate nodes MIDB/MID (i.e., a first intermediate node MIDB and a second intermediate node MID).

The intermediate nodes MIDB/MIB may include nodes between the output terminals and the input terminals, that is, between the differential output terminals LAT/LATB and the differential input terminals IN/INB.

For example, the intermediate nodes MIDB/MIB may include a first intermediate node MIDB coupled between the output terminal LAT and the input terminal IN and a second intermediate node MID coupled between the output terminal LATB and the input terminal INB.

The sixth transistor 206 and the seventh transistor 207 may be coupled to the intermediate nodes MIDB/MID, respectively.

The differential input terminals IN/INB may be coupled to the gates of the sixth and seventh transistors 206 and 207, respectively.

The drain of the eighth transistor 208 may be commonly coupled to the sources of the sixth and seventh transistors 206 and 207.

The gate of the eighth transistor 208 may be configured to receive the clock signal CLK, and the source of the eighth transistor 208 may be coupled to the ground terminal GND.

The reset unit 300 may be configured to reset the differential output terminals LAT/LATB and the intermediate nodes MIDB and MID to the level of the power supply terminal VDD, when the clock signal CLK is deactivated.

The reset unit 300 may include first to fourth transistors 301 to 304.

The first transistor 301 and the second transistor 302 may be coupled between the power supply terminal VDD and the differential output terminals LAT/LATB, respectively.

The third transistor 303 and the fourth transistor 304 may be coupled between the power supply terminal VDD and the intermediate output terminals MIDB/MIB, respectively.

The gate of the first transistor 301 may be coupled to the gate of the third transistor 303. The gate of the third transistor 303 may be configured for receiving a clock signal.

The gate of the second transistor 302 may be coupled to the gate of the fourth transistor 304. The gate of the fourth transistor 304 may be configured for receiving a clock signal.

The equalization unit 400 may be configured to perform an equalization function by adjusting the voltage levels of the differential output terminals LAT/LATB in response to differential feedback signals FEED/FEEDB.

The equalization unit 400 may include first to third transistors 401 to 403.

The differential output terminals LAT/LATB may be coupled to the first and second transistors 401 and 402, respectively.

The gate of the first transistor 401 may be configured to receive the feedback signal FEED of the differential feedback signals FEED/FEEDB, and the gate of the second transistor 402 may be configured to receive the feedback signal FEEDB of the differential feedback signals FEED/FEEDB.

The drain of the third transistor 403 may be commonly coupled to the source of the first transistor 401 and the source of the second transistor 402. The source of the third transistor 403 may be coupled to the ground terminal GND. The gate of the third transistor 403 may be configured to receive the clock signal CLK.

The feedback signal generation unit 500 may be configured to generate signals obtained by latching previous input data, that is, signals obtained by latching outputs of the differential output terminals LAT/LATB, as the differential feedback signals FEED/FEEDB.

The feedback signal generation unit 500 may include first to fourth inverters 501, 502, 505, and 508 and first to fourth transistors 503, 504, 506, and 507.

The first and second inverters 501 and 502 may be configured to invert and output the logic levels of the differential output terminals LAT/LATB.

The third inverter 505 and the first to fourth transistors 503, 504, 506, and 507 may be configured to change the levels of the differential feedback signals FEED/FEEDB in response to the logic levels of the differential output terminals LAT/LATB and the logic levels of signals LAT1B and LAT1 obtained by inverting the logic levels of the differential output terminals LAT/LATB.

For example, the gate of the first transistor 503 and the gate of the third transistor 506 may receive signals from the differential output terminals LAT/LATB, respectively. The gate of the second transistor 504 and the gate of the fourth transistor 507 may receive the signals LAT1 and LAT1B, respectively. The input of the third inverter 505 may be coupled between the first transistor 503 and the second transistor 504. The output of the third inverter 505 may be coupled between the third and fourth transistors 507 and 507. The first transistor 503 and third transistor 506 may also be coupled to a power supply terminal VDD. The second transistor 504 and fourth transistor 507 may be coupled to a ground terminal GND.

Figure 2:
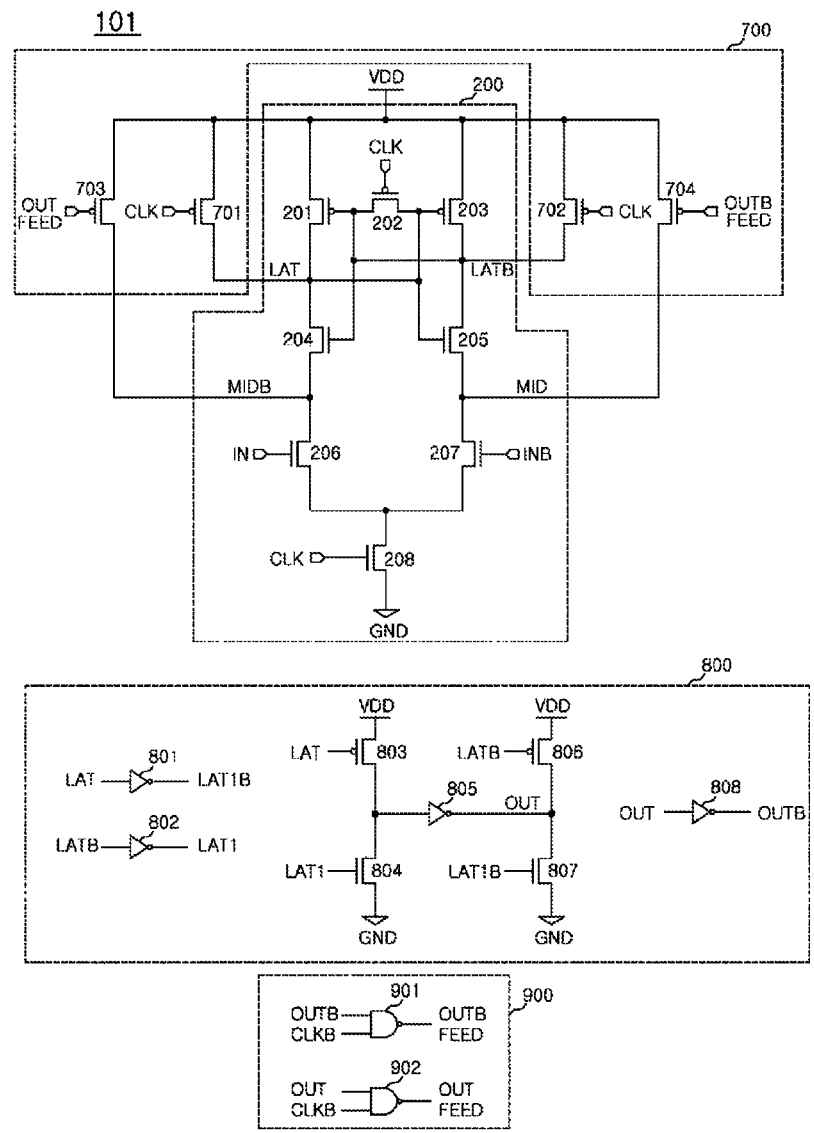
FIG. 2 is a circuit diagram of a representation of a receiver circuit of a semiconductor apparatus according to an embodiment.

Referring to FIG. 2, a receiver circuit 101 of a semiconductor apparatus according to an embodiment may include a latch unit 200, a reset unit 700, a feedback signal generation unit 800, and a control unit 900.

The latch unit 200 may be configured to change the logic levels of differential output terminals LAT/LATB. The changing of the logic levels may be performed in accordance with a difference between two pieces of data or two or more data received through differential input terminals IN/INB, when a clock signal CLK is activated to a high level.

When the clock signal CLK is deactivated to a low level, the latch unit 200 and a ground terminal GND may be decoupled from each other.

The latch unit 200 may be implemented with a cross-coupled latch, and may include first to eighth transistors 201 to 208.

The first transistor 201 and the third transistor 203 may be respectively coupled between a power supply terminal VDD and the differential output terminals LAT/LATB.

The source and drain of the second transistor 202 may be coupled to the gate of the first transistor 201 and the gate of the third transistor 203, respectively.

The gate of the second transistor 202 may be configured to receive the clock signal CLK.

The fourth transistor 204 and the fifth transistor 205 may be respectively coupled between the differential output terminals LAT/LAB and intermediate nodes MIDB/MID.

The intermediate nodes MIDB/MIB may include nodes between the output terminals and the input terminals, that is, between the differential output terminals LAT/LATB and the differential input terminals IN/INB.

The drains of the sixth and seventh transistors 206 and 207 may be coupled to the respective intermediate nodes MIDB/MID.

The differential input terminals IN/INB may be coupled to the respective gates of the sixth and seventh transistors 206 and 207.

The gate of the eighth transistor 208 may be commonly coupled to the sources of the sixth and seventh transistors 206 and 207.

The gate of the eighth transistor 208 may be configured to receive the clock signal CLK, and the source of the eighth transistor 208 may be coupled to the ground terminal GND.

The reset unit 700 may be configured to perform an equalization function by selectively resetting the intermediate nodes MIDB/MID in response to the control signals OUTFEED/OUTBFEED.

For example, the reset unit 700 may perform an equalization function by selectively resetting any one of the intermediate nodes MIDB/MIB. Any one of the intermediate nodes MIDB/MIB may be reset to the level of the power supply terminal VDD in response to the control signals OUTFEED/OUTBFEED.

Furthermore, the reset unit 700 may be configured to reset the differential output terminals LAT/LATB. The differential output terminals LAT/LATB may be reset to the level of the power supply terminal VDD in response to the clock signal CLK.

The reset unit 700 may include the first to fourth transistors 701 to 704.

The source of the first transistor 701 may be coupled to the power supply terminal VDD. The drain of the first transistor 701 may be coupled to the output terminal LAT of the differential output terminals LAT/LATB. The gate of the first transistor 701 may be configured to receive the clock signal CLK.

The source of the second transistor 702 may be coupled to the power supply terminal VDD. The drain of the second transistor 702 may be coupled to the output terminal LATB of the differential output terminals LAT/LATB. The gate of the second transistor 702 may receive the clock signal CLK.

The source of the third transistor 703 may be coupled to the power supply terminal VDD. The drain of the third transistor 703 may be coupled to the intermediate node MIDB of the intermediate nodes MID/MIDB. The gate of the third transistor 703 may receive the control signal OUTFEED of the control signals OUTFEED/OUTBFEED.

The source of the fourth transistor 704 may be coupled to the power supply terminal VDD. The drain of the fourth transistor 704 may be coupled to the intermediate node MID of the intermediate nodes MID/MIDB. The gate of the fourth transistor 704 may receive the control signal OUTBFEED of the control signals OUTFEED/OUTBFEED.

The feedback signal generation unit 800 may be configured to output signals obtained by latching previous input data, that is, signals obtained by latching outputs of the differential output terminals LAT/LATB, as differential feedback signals OUT/OUTB.

The feedback signal generation unit 800 may include first to fourth inverters 801, 802, 805, and 808 and first to fourth transistors 803, 804, 806, and 807.

The first and second inverters 801 and 802 may be configured to invert and output the logic levels of the differential output terminals LAT/LATB.

The third inverter 805 and the first to fourth transistors 803, 804, 806, and 807 may be configured to change the logic levels of the differential feedback signals OUT/OUTB in response to the logic levels of the differential output terminals LAT/LATB and the logic levels of signals LAT1B and LAT1 obtained by inverting the logic levels of the differential output terminals LAT/LATB.

For example, the gate of the first transistor 803 and the gate of the third transistor 806 may receive signals from the differential output terminals LAT/LATB, respectively. The gate of the second transistor 804 and the gate of the fourth transistor 807 may receive the signals LAT1 and LAT1B, respectively. The input of the third inverter 805 may be coupled between the first transistor 803 and the second transistor 804. The output of the third inverter 805 may be coupled between the third and fourth transistors 807 and 807. The first transistor 803 and third transistor 806 may also be coupled to a power supply terminal VDD. The second transistor 804 and fourth transistor 807 may be coupled to a ground terminal GND.

The control unit 900 may be configured to generate the control signals OUTFEED/OUTBFEED for selectively resetting the intermediate nodes MID/MIDB according to the previous input data, during a reset condition of the receiver circuit 101.

The control unit 900 may use the differential feedback signals OUT/OUT as the previous input data.

The differential feedback signals OUT/OUTB may include signals obtained by latching the previous input data.

The control unit 900 may use the inverted clock signal CLKB as a reset condition of the receiver circuit 101.

The receiver circuit 101 may be reset when the clock signal CLK is deactivated, that is, during the low level period. During the low level period of the clock signal CLK, the inverted clock signal CLKB may maintain the high level.

The control unit 900 may combine the differential feedback signals OUT/OUTB and the inverted clock signal CLKB, and generate the control signals OUTFEED/OUTBFEED.

The control unit 900 may include a first NAND gate 901 and a second NAND gate 902.

The first NAND gate 901 may generate the control signal OUTFEED. The control signal OUTFEED may be generated by performing a NAND operation on the feedback signal OUTB and the inverted clock signal CLKB with the first NAND gate 901.

The second NAND gate 902 may generate the control signal OUTBFEED. The control signal OUTBFEED may be generated by performing a NAND operation on the feedback signal OUT and the inverted clock signal CLKB with the second NAND gate 902.

The operation of the receiver circuit 101 in accordance with an embodiment will be described with reference to FIG. 3.

Figure 3:
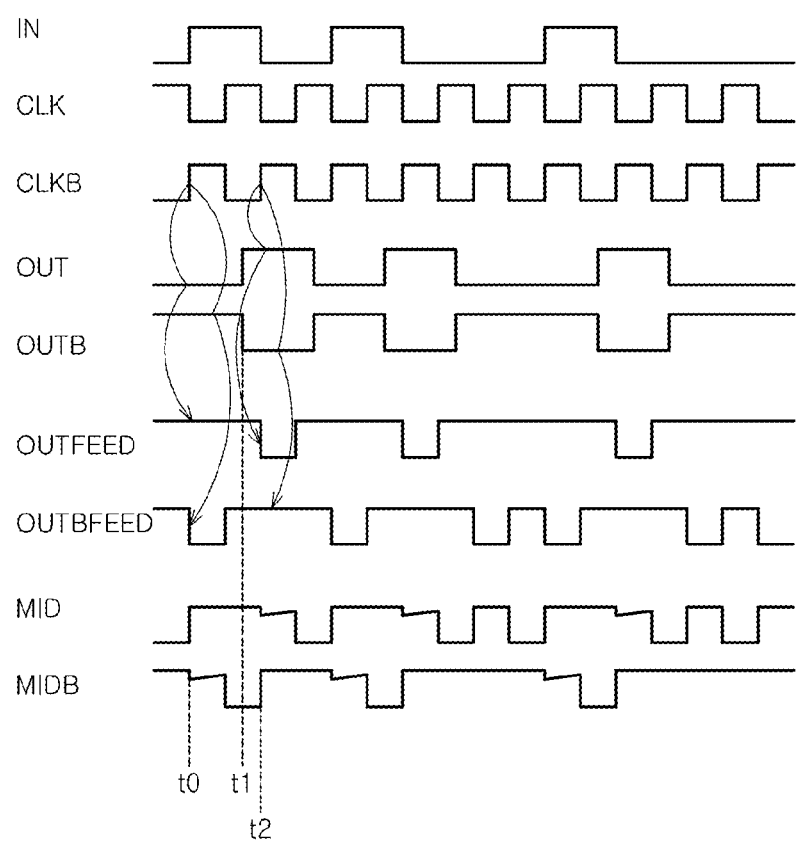
FIG. 3 is a waveform diagram for explaining the operation of the receiver circuit of FIG. 2.

Referring to FIG. 3, data is inputted through the input terminal IN, and a clock signal CLK and an inverted clock signal CLKB are received.

At a first timing t0, the inverted clock signal CLKB transitions to a high level.

At the first timing t0, previous data, that is, a feedback signal OUT and a feedback signal OUTB are at a low level and high level, respectively.

Since the inverted clock signal CLKB is at a high level, the feedback signal OUT is at a low level, and the feedback signal OUTB is at a high level, the control unit 900 outputs the control signal OUTFEED at the high level, and outputs the control signal OUTBFEED at the low level.

Since the control signal OUTFEED is at the high level and the control signal OUTBFEED is at the low level, the reset unit 700 resets only the second intermediate node MID of the first and second nodes MIDB and MID to the level of the power supply terminal VDD.

The voltage level of the first intermediate node MIDB drops by a voltage variation caused by the input data receiving operation of the latch unit 200, and becomes lower than the level of the power supply terminal VDD.

That is, according to the voltage variations of the output terminal LAT and the input terminal IN and the transistors coupled to the output terminal LAT and the input terminal IN in FIG. 2, the voltage level of the first intermediate node MIDB becomes lower than the level of the power supply terminal VDD.

As the voltage level of the first intermediate node MIDB becomes lower than the level of the power supply terminal VDD while the second intermediate node MID is reset to the level of the power supply terminal VDD, an equalization function, that is, a DFE (Decision Feedback Equalization) function may be performed.

Then, at a second timing t1, the feedback signal OUT obtained by latching the high-level data inputted at the first timing t0 transitions to the high level, and the feedback signal OUTB transitions to the low level.

At a third timing t3, the inverted clock signal CLKB transitions to the high level, the feedback signal OUT is at the high level, and the feedback signal OUTB is at the low level. Thus, the control unit 900 outputs the control signal OUTFEED at the low level, and outputs the control signal OUTBFEED at the high level.

Since the control signal OUTFEED is at the low level and the control signal OUTBFEED is at the high level, the reset unit 700 resets only the first intermediate node MIDB of the first and second intermediate nodes MIDB and MID to the level of the power supply terminal VDD.

The voltage level of the second intermediate node MID drops by a voltage variation caused by the input data receiving operation of the latch unit 200, and becomes lower than the level of the power supply terminal VDD.

That is, the voltage level of the second intermediate node MID becomes lower than the level of the power supply terminal VDD according to the voltage variations of the output terminal LATB and the input terminal INB and the transistors coupled to the output terminal LATB and the input terminal INB in FIG. 2.

According to an embodiment, the receiver circuit 101 may selectively reset any one of the first and second intermediate nodes MIDB and MID according to the previous data level, using the circuit configuration for the reset function, without adding separate transistors for equalization to the differential output terminals LAT/LATB. Thus, the receiver circuit 101 may perform the reset and equalization functions simultaneously.

Since the reset and equalization functions are received at a time through the circuit configuration for the reset function, the receiving efficiency may be improved, and the current consumption may be reduced.

Figure 4:
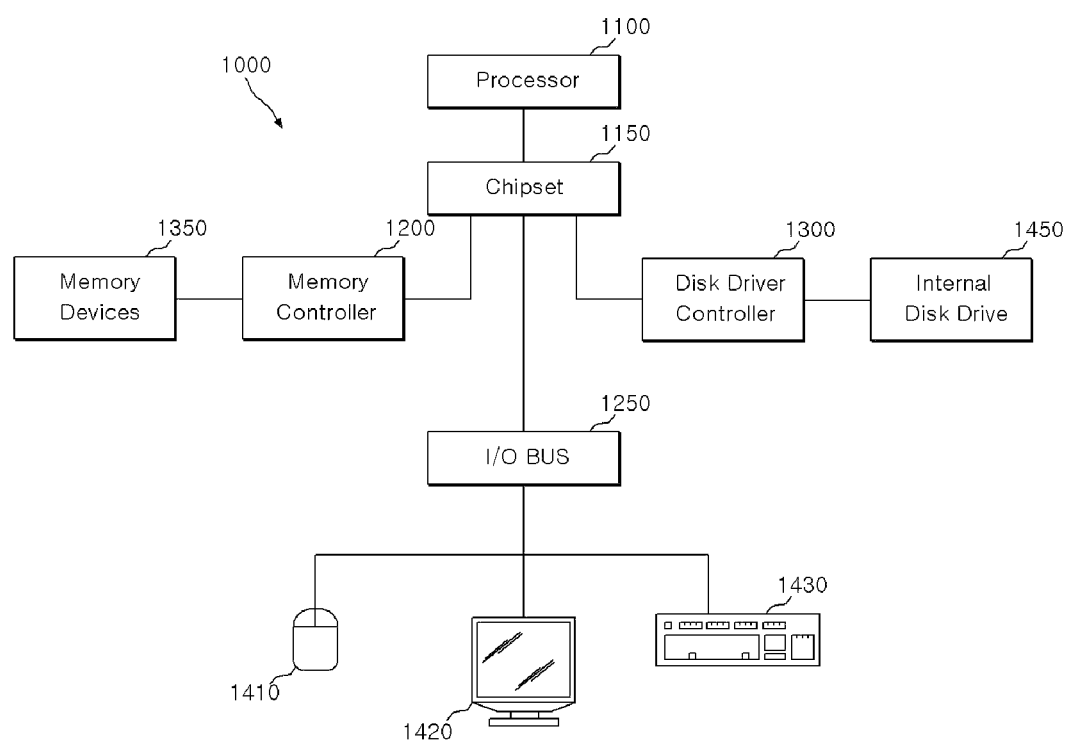
FIG. 4 illustrates a block diagram of an example of a representation of a system employing the receiver circuit in accordance with the embodiments discussed above with relation to FIGS. 1-3.

The receiver circuits discussed above (see FIGS. 1-3) are particular useful in the design of memory devices, processors, and computer systems. For example, referring to FIG. 4, a block diagram of a system employing the receiver circuit in accordance with the embodiments are illustrated and generally designated by a reference numeral 1000. The system 1000 may include one or more processors or central processing units ("CPUs") 1100. The CPU 1100 may be used individually or in combination with other CPUs. While the CPU 1100 will be referred to primarily in the singular, it will be understood by those skilled in the art that a system with any number of physical or logical CPUs may be implemented.

A chipset 1150 may be operably coupled to the CPU 1100. The chipset 1150 is a communication pathway for signals between the CPU 1100 and other components of the system 1000, which may include a memory controller 1200, an input/output ("I/O") bus 1250, and a disk drive controller 1300. Depending on the configuration of the system, any one of a number of different signals may be transmitted through the chipset 1150, and those skilled in the art will appreciate that the routing of the signals throughout the system 1000 can be readily adjusted without changing the underlying nature of the system.

As stated above, the memory controller 1200 may be operably coupled to the chipset 1150. The memory controller 1200 may include at least one receiver circuit as discussed above with reference to FIGS. 1-3. Thus, the memory controller 1200 can receive a request provided from the CPU 1100, through the chipset 1150. In alternate embodiments, the memory controller 1200 may be integrated into the chipset 1150. The memory controller 1200 may be operably coupled to one or more memory devices 1350. In an embodiment, the memory devices 1350 may include the at least one receiver circuit as discussed above with relation to FIGS. 1-3, the memory devices 1350 may include a plurality of word lines and a plurality of bit lines for defining a plurality of memory cell. The memory devices 1350 may be any one of a number of industry standard memory types, including but not limited to, single inline memory modules ("SIMMs") and dual inline memory modules ("DIMMs"). Further, the memory devices 1350 may facilitate the safe removal of the external data storage devices by storing both instructions and data.

The chipset 1150 may also be coupled to the I/O bus 1250. The I/O bus 1250 may serve as a communication pathway for signals from the chipset 1150 to I/O devices 1410, 1420 and 1430. The I/O devices 1410, 1420 and 1430 may include a mouse 1410, a video display 1420, or a keyboard 1430. The I/O bus 1250 may employ any one of a number of communications protocols to communicate with the I/O devices 1410, 1420, and 1430. Further, the I/O bus 1250 may be integrated into the chipset 1150.

The disk drive controller 1450 (i.e., internal disk drive) may also be operably coupled to the chipset 1150. The disk drive controller 1450 may serve as the communication pathway between the chipset 1150 and one or more internal disk drives 1450. The internal disk drive 1450 may facilitate disconnection of the external data storage devices by storing both instructions and data. The disk drive controller 1300 and the internal disk drives 1450 may communicate with each other or with the chipset 1150 using virtually any type of communication protocol, including all of those mentioned above with regard to the I/O bus 1250.

It is important to note that the system 1000 described above in relation to FIG. 4 is merely one example of a system employing the receiver circuit as discussed above with relation to FIGS. 1-3. In alternate embodiments, such as cellular phones or digital cameras, the components may differ from the embodiments illustrated in FIG. 4.

While various embodiments have been described above, it will be understood to those skilled in the art that the embodiments described are by way of example only. Accordingly, the semiconductor apparatuses described herein should not be limited based on the described embodiments. Rather, the semiconductor apparatus described herein should only be limited in light of the claims that follow when taken in conjunction with the above description and accompanying drawings.

What is claimed is:

1. A receiver circuit of a semiconductor apparatus, comprising:
   a latch unit configured to change logic levels of differential output terminals according to a difference between two data inputted through differential input terminals;
   a reset unit configured to perform an equalization function by selectively resetting one of first and second intermediate nodes in response to control signals; and
   a control unit configured to generate the control signals according to a reset condition and previous input data.

2. The receiver circuit according to claim 1, wherein the reset unit is configured to reset only one of the first and second intermediate nodes in response to the control signals.

3. The receiver circuit according to claim 2, wherein a voltage level of the other intermediate node drops to a lower level than a level of a power supply terminal.

4. The receiver circuit according to claim 1, wherein the reset unit resets the differential output terminals to a level of a power supply terminal, in response to a clock signal.

5. The receiver circuit according to claim 1, wherein the control unit uses a clock signal as the reset condition.

6. The receiver circuit according to claim 1, wherein the control unit uses signals, obtained by latching outputs of the differential output terminals, as the previous input data.

7. The receiver circuit according to claim 1, wherein the control unit is configured to generate the control signals by combining a clock signal with signals obtained by latching outputs of the differential output terminals.

8. A receiver circuit of a semiconductor apparatus, comprising:
 a latch unit comprising differential input terminals and differential output terminals; and
 a control unit configured to selectively reset one of first and second intermediate nodes according to previous data.

9. The receiver circuit according to claim 8, wherein the control unit is configured to reset only one of the first and second intermediate nodes in response to the control signals.

10. The receiver circuit according to claim 9, wherein a voltage level of the other intermediate node drops to a lower level than a level of a power supply terminal.

11. The receiver circuit according to claim 8, wherein the differential output terminals are reset to a level of a power supply terminal in response to a clock signal.

12. The receiver circuit according to claim 8, wherein the control unit is configured to determine the previous data according to signals obtained by latching outputs of the differential output terminals.

13. The receiver circuit according to claim 12, wherein the control unit is configured to selectively reset the one of the first and second intermediate nodes in response to results obtained by combining a clock signal with the signals obtained by latching the outputs of the differential output terminals.

14. A receiver circuit of a semiconductor apparatus, comprising:
 a latch unit configured to change logic levels of differential output terminals according to a difference between a first data and a second data inputted through differential input terminals;
 a feedback signal generation unit configured to output signals obtained by latching outputs of the differential output terminals as differential feedback signals;
 a reset unit configured to perform an equalization function by selectively resetting one of first and second intermediate nodes in response to control signals; and
 a control unit configured to generate the control signals in response to the differential feedback signals and a clock signal.

15. The receiver circuit according to claim 14, wherein the reset unit is configured to reset only one of the first and second intermediate nodes in response to the control signals.

16. The receiver circuit according to claim 15, wherein a voltage level of the other intermediate node drops to a lower level than a level of a power supply terminal.

17. The receiver circuit according to claim 14, wherein the reset unit is configured to reset the differential output terminals to a level of a power supply terminal, in response to the clock signal.

18. The receiver circuit according to claim 1, wherein the first intermediate node is coupled between one of the differential input terminals and one of the differential output terminals, and
 wherein the second intermediate node is coupled between one of the differential input terminals different from what the first intermediate node is coupled with and one of the differential output terminals different from what the first intermediate node is coupled with.

19. The receiver circuit according to claim 8, wherein the first intermediate node is coupled between one of the differential input terminals and one of the differential output terminals, and
 wherein the second intermediate node is coupled between one of the differential input terminals different from what the first intermediate node is coupled with and one of the differential output terminals different from what the first intermediate node is coupled with.

20. The receiver circuit according to claim 14, wherein the first intermediate node is coupled between one of the differential input terminals and one of the differential output terminals, and
 wherein the second intermediate node is coupled between one of the differential input terminals different from what the first intermediate node is coupled with and one of the differential output terminals different from what the first intermediate node is coupled with.

* * * * *